(12) United States Patent
He

(10) Patent No.: US 9,935,137 B2
(45) Date of Patent: Apr. 3, 2018

(54) MANUFACTURE METHOD OF LTPS ARRAY SUBSTRATE

(71) Applicant: Wuhan China Star Optoelectronics Technology Co., Ltd., Wuhan (CN)

(72) Inventor: Chao He, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 136 days.

(21) Appl. No.: 15/115,692

(22) PCT Filed: May 26, 2016

(86) PCT No.: PCT/CN2016/083563
§ 371 (c)(1),
(2) Date: Aug. 1, 2016

(87) PCT Pub. No.: WO2017/128575
PCT Pub. Date: Aug. 3, 2017

(65) Prior Publication Data
US 2018/0069034 A1 Mar. 8, 2018

(30) Foreign Application Priority Data
Jan. 28, 2016 (CN) .......................... 2016 1 0060729

(51) Int. Cl.
*H01L 27/12* (2006.01)
*G02F 1/1335* (2006.01)
*G02F 1/1362* (2006.01)

(52) U.S. Cl.
CPC .... *H01L 27/1288* (2013.01); *G02F 1/133514* (2013.01); *G02F 1/136209* (2013.01); *H01L 27/1222* (2013.01); *H01L 27/1274* (2013.01)

(58) Field of Classification Search
CPC ............. H01L 27/1288; H01L 27/1222; H01L 27/1274; G02F 1/133514; G02F 1/136209; G02F 2001/136231; G02F 2001/136236
See application file for complete search history.

(56) References Cited

U.S. PATENT DOCUMENTS 7,309,625 B2 * 12/2007 Yen ...................... H01L 27/1214
257/E29.278
8,367,278 B2 * 2/2013 Kwon ....................... G03F 1/50
430/5
8,999,771 B2 * 4/2015 Hung .................. H01L 27/1248
257/213

(Continued)

*Primary Examiner* — Jarrett Stark
*Assistant Examiner* — Charles N Ausar-El
(74) *Attorney, Agent, or Firm* — Leong C. Lei

(57) ABSTRACT

The present invention provides a manufacture method of a LTPS array substrate. By utilizing one halftone mask, the N type heavy doping, the channel doping of the first polysilicon layer of the NMOS region and the P type heavy doping of the second polysilicon layer of the PMOS region, the three processes which previously require three masks are integrated into one mask process, and two exposure processes are eliminated, which significantly raises the exposure capacity, and meanwhile saves the manufacture cost of two masks to effectively reduce the manufacture cost of the LTPS array substrate, and the manufactured LTPS array substrate possesses great electrical property.

17 Claims, 11 Drawing Sheets

(56) References Cited

U.S. PATENT DOCUMENTS

| | | | |
|---|---|---|---|
| 9,640,569 B2* | 5/2017 | Xue | H01L 29/66598 |
| 9,759,941 B2* | 9/2017 | Yang | G02F 1/13338 |
| 9,768,308 B2* | 9/2017 | Lu | H01L 29/78618 |
| 9,869,912 B2* | 1/2018 | Xu | G02F 1/136209 |
| 2006/0006469 A1* | 1/2006 | Hwang | H01L 21/84 257/351 |
| 2009/0176325 A1* | 7/2009 | Jeon | G03F 7/70791 438/34 |
| 2012/0171822 A1* | 7/2012 | Yuan | H01L 21/0274 438/166 |
| 2015/0206905 A1* | 7/2015 | Wang | H01L 29/78621 257/72 |
| 2016/0254389 A1* | 9/2016 | Lu | H01L 21/28518 257/72 |
| 2017/0160611 A1* | 6/2017 | Xu | G02F 1/136209 |

\* cited by examiner

MANUFACTURE METHOD OF LTPS ARRAY SUBSTRATE

FIELD OF THE INVENTION

The present invention relates to a display technology field, and more particularly to a manufacture method of a LTPS array substrate.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. Generally, the liquid crystal display panel comprises a CF (Color Filter) substrate, a TFT (Thin Film Transistor) substrate, a LC (Liquid Crystal) sandwiched between the CF substrate and the TFT substrate and sealant.

Low Temperature Poly Silicon (LTPS) is a kind of liquid crystal display technology which has been widely applied in the small, medium size electronic products. The electron mobility of the traditional amorphous silicon material is about 0.5-1.0 $cm^2/V \cdot S$ but the electron mobility of the Low Temperature Poly Silicon can reach up to 30-300 $cm^2/V \cdot S$. Therefore, the Low Temperature Poly Silicon display has many advantages of high resolution, fast response speed and high aperture ratio.

However, on the other hand, the volume of the LTPS semiconductor element is small and the integration is high. The manufacture process of the entire LTPS array substrate is complicated, and the production cost is higher.

As shown in FIGS. 1-6, the manufacture method of CMOS (Complementary Metal Oxide Semiconductor) LTPS array substrate according to prior art comprises steps of:

step 1, as shown in FIG. 1, providing a substrate 100, and defining a NMOS (Negative channel Metal Oxide Semiconductor) region and a PMOS (Positive channel Metal Oxide Semiconductor) region on the substrate 100, and depositing a first metal layer on the substrate 100, and patterning the first metal layer with the photolithographic process to obtain a light shielding layer 200 in the NMOS region;

step 2, as shown in FIG. 2, sequentially depositing a buffer layer 300 and an amorphous silicon layer (a-Si) on the and the substrate 100, and converting the amorphous silicon layer (a-Si) into the polysilicon layer (poly-Si) by an Excimer Laser Annealing process (ELA), and patterning the polysilicon layer with the photolithographic process to obtain a first polysilicon layer 410 in the NMOS region and a second polysilicon layer 420 in the PMOS region;

step 3, as shown in FIG. 3, coating a first photoresist layer 510 on the first polysilicon layer 410, the second polysilicon layer 420 and the buffer layer 300, and after employing a mask to implement exposure, development to the first photoresist layer 510, implementing channel doping to the first polysilicon layer 410 in the NMOS region;

step 4, as shown in FIG. 4, coating a second photoresist layer 520 on the first polysilicon layer 410, the second polysilicon layer 420 and the buffer layer 300, and after employing a mask to implement exposure, development to the second photoresist layer 520, implementing N type heavy doping to two ends of the first polysilicon layer 410 in the NMOS region;

step 5, as shown in FIG. 5, sequentially depositing a gate insulation layer 600 and a second metal layer on the first polysilicon layer 410, the second polysilicon layer 420 and the buffer layer 300, and patterning the second metal layer to obtain a first gate 710 and a second gate 720 correspondingly above the first polysilicon layer 410 and the second polysilicon layer 420, respectively; employing the first gate 710 to implement N type light doping to the first polysilicon layer 410;

step 6, as shown in FIG. 6, coating a third photoresist layer 800 on the first gate 710, the second gate 720 and the gate insulation layer 600, and after employing a mask to implement exposure, development to the third photoresist layer 800, implementing P type heavy doping to two ends of the second polysilicon layer 420;

step 7, sequentially manufacturing structures, such as an interlayer insulation layer, a source-drain layer, a flat layer, a common electrode layer, a passivation layer and a pixel electrode layer on the first gate 710, the second gate 720 and the gate insulation layer 600.

In the aforesaid manufacture method of the LTPS array substrate, all these three processes of the channel doping and N type heavy doping of the first polysilicon layer 410 of the NMOS region, and the P type heavy doping of the second polysilicon layer 420 of the PMOS require the photolithographic process to implement doping, and needs three masks in total. The manufacture process is complicated and the production cost is high. Therefore, there is a need to provide a manufacture method of a LTPS array substrate to solve the technical problem.

SUMMARY OF THE INVENTION

An objective of the present invention is to provide a manufacture method of a LTPS array substrate, which can effectively reduce the manufacture cost of the LTPS array substrate, and the manufactured LTPS array substrate possesses great electrical property.

For realizing the aforesaid objectives, the present invention provides a manufacture method of a LTPS array substrate, comprising steps of:

step 1, providing a substrate, and defining a NMOS region and a PMOS region on the substrate, and depositing a first metal layer on the substrate, and patterning the first metal layer to obtain a light shielding layer in the NMOS region;

step 2, forming a buffer layer on the light shielding layer and the substrate, and depositing an amorphous silicon layer on the buffer layer, and employing a low temperature crystallization process to convert the amorphous silicon layer into the polysilicon layer, and patterning the polysilicon layer to obtain a first polysilicon layer in the NMOS region and a second polysilicon layer in the PMOS region;

step 3, coating a photoresist layer on the first polysilicon layer, the second polysilicon layer and the buffer layer, and after employing a halftone mask to implement exposure, development to the photoresist layer, forming first vias corresponding to two ends of the second polysilicon layer in the photoresist layer to expose the two ends of the second polysilicon layer, and meanwhile, forming first grooves corresponding to two ends of the first polysilicon layer in the photoresist layer; employing the photoresist layer to be a mask to implement P type heavy doping to the two ends of the second polysilicon layer to obtain two P type heavy doping regions, and forming a second channel region on the second polysilicon layer in a region between the two P type heavy doping regions;

employing a dry etching process to implement ashing treatment to the photoresist layer to decrease a thickness of the photoresist layer to make the first grooves converted into second vias to expose the two ends of the first polysilicon layer, and employing the photoresist layer to be a mask to implement N type heavy doping to the two ends of the first polysilicon layer to obtain two N type heavy doping regions;

employing a photoresist stripping process to completely strip the rest photoresist layer to expose the first polysilicon layer and the second polysilicon layer, and implementing P type light doping to the first polysilicon layer and the second polysilicon layer to achieve channel doping to the first polysilicon layer.

The manufacture method of a LTPS array substrate further comprises steps of:

step 4, depositing a gate isolation layer on the first polysilicon layer, the second polysilicon layer and the buffer layer, and depositing a second metal layer on the gate isolation layer, and patterning the second metal layer to obtain a first gate and a second gate correspondingly above the first polysilicon layer and the second polysilicon layer, respectively;

employing the first gate to be a mask to implement N type light doping to the first polysilicon layer to obtain two N type light doping regions respectively at inner sides of the two N type heavy doping regions, and a first channel region is formed in a region between the two N type heavy doping regions on the first polysilicon layer;

step 5, depositing an interlayer insulation layer on the first gate, the second gate and the gate isolation layer, and patterning the interlayer insulation layer and the gate isolation layer to obtain a first via above the N type heavy doping region and a second via above the P type heavy doping region;

step 6, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second drain respectively contact with the P type heavy doping region through the second via;

step 7, forming a flat layer on the first source, the first drain, the second source, the second drain and the interlayer insulation layer, and patterning the flat layer to obtain a third via above the first drain;

step 8, depositing a first transparent conductive oxide layer on the flat layer, and patterning the first transparent conductive oxide layer to obtain a common electrode;

step 9, depositing a passivation protective layer on the common electrode and the flat layer, and the passivation protective layer covers the third via on the flat layer, and then patterning the passivation protective layer to obtain a fourth via at a bottom of the third via on the passivation protective layer;

step 10, depositing a second transparent conductive oxide layer on the passivation protective layer, and patterning the second transparent conductive oxide layer to obtain a pixel electrode, and the pixel electrode contacts with the first drain through the fourth via.

In the step 2, the low temperature crystallization process is Excimer Laser Annealing or Metal-Induced Lateral Crystallization.

In the step 3, the ion doped by the P type heavy doping is boron ion, and a doping dose is $1*10^{15}$ ions/cm$^2$; the ion doped by the N type heavy doping is phosphorus ion, and a doping dose is $4*10^{14}$ ions/cm$^2$; the ion doped by the P type light doping is boron ion, and a doping dose is $2*10^{12}$ ions/cm$^2$.

In the step 4, the ion doped by the N type light doping is phosphorus ion, and a doping dose is $1.5*10^{13}$ ions/cm$^2$.

The step 5 further comprises implementing the dehydrogenation and activation treatments to the interlayer insulation layer.

Rapid thermal annealing is employed to implement the dehydrogenation and activation treatments to the interlayer insulation layer.

The substrate is a glass substrate; material of the first metal layer, the second metal layer and the third metal layer is a stack combination of one or more of molybdenum, titanium, aluminum and copper; the buffer layer, the gate isolation layer, the interlayer insulation layer and the passivation protective layer are Silicon Oxide layers, Silicon Nitride layers or composite layers superimposed with Silicon Oxide layers and Silicon Nitride layers; the flat layer is organic photoresist material.

Material of the first transparent conductive oxide layer and the second transparent conductive oxide layer is metal oxide.

The metal oxide is Indium Tin Oxide, Aluminum Tin Oxide, Aluminum Zinc Oxide or Indium Germanium Zinc Oxide.

The present invention further provides a manufacture method of a LTPS array substrate, comprising steps of:

step 1, providing a substrate, and defining a NMOS region and a PMOS region on the substrate, and depositing a first metal layer on the substrate, and patterning the first metal layer to obtain a light shielding layer in the NMOS region;

step 2, forming a buffer layer on the light shielding layer and the substrate, and depositing an amorphous silicon layer on the buffer layer, and employing a low temperature crystallization process to convert the amorphous silicon layer into the polysilicon layer, and patterning the polysilicon layer to obtain a first polysilicon layer in the NMOS region and a second polysilicon layer in the PMOS region;

step 3, coating a photoresist layer on the first polysilicon layer, the second polysilicon layer and the buffer layer, and after employing a halftone mask to implement exposure, development to the photoresist layer, forming first vias corresponding to two ends of the second polysilicon layer in the photoresist layer to expose the two ends of the second polysilicon layer, and meanwhile, forming first grooves corresponding to two ends of the first polysilicon layer in the photoresist layer; employing the photoresist layer to be a mask to implement P type heavy doping to the two ends of the second polysilicon layer to obtain two P type heavy doping regions, and forming a second channel region on the second polysilicon layer in a region between the two P type heavy doping regions;

employing a dry etching process to implement ashing treatment to the photoresist layer to decrease a thickness of the photoresist layer to make the first grooves converted into second vias to expose the two ends of the first polysilicon layer, and employing the photoresist layer to be a mask to implement N type heavy doping to the two ends of the first polysilicon layer to obtain two N type heavy doping regions;

employing a photoresist stripping process to completely strip the rest photoresist layer to expose the first polysilicon layer and the second polysilicon layer, and implementing P type light doping to the first polysilicon layer and the second polysilicon layer to achieve channel doping to the first polysilicon layer;

step 4, depositing a gate isolation layer on the first polysilicon layer, the second polysilicon layer and the buffer layer, and depositing a second metal layer on the gate isolation layer, and patterning the second metal layer to obtain a first gate and a second gate correspondingly above the first polysilicon layer and the second polysilicon layer, respectively;

employing the first gate to be a mask to implement N type light doping to the first polysilicon layer to obtain two N type light doping regions respectively at inner sides of the two N type heavy doping regions, and a first channel region is formed in a region between the two N type heavy doping regions on the first polysilicon layer;

step 5, depositing an interlayer insulation layer on the first gate, the second gate and the gate isolation layer, and patterning the interlayer insulation layer and the gate isolation layer to obtain a first via above the N type heavy doping region and a second via above the P type heavy doping region;

step 6, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second drain respectively contact with the P type heavy doping region through the second via;

step 7, forming a flat layer on the first source, the first drain, the second source, the second drain and the interlayer insulation layer, and patterning the flat layer to obtain a third via above the first drain;

step 8, depositing a first transparent conductive oxide layer on the flat layer, and patterning the first transparent conductive oxide layer to obtain a common electrode;

step 9, depositing a passivation protective layer on the common electrode and the flat layer, and the passivation protective layer covers the third via on the flat layer, and then patterning the passivation protective layer to obtain a fourth via at a bottom of the third via on the passivation protective layer;

step 10, depositing a second transparent conductive oxide layer on the passivation protective layer, and patterning the second transparent conductive oxide layer to obtain a pixel electrode, and the pixel electrode contacts with the first drain through the fourth via;

wherein in the step 2, the low temperature crystallization process is Excimer Laser Annealing or Metal-Induced Lateral Crystallization;

wherein in the step 3, the ion doped by the P type heavy doping is boron ion, and a doping dose is $1*10^{15}$ ions/cm$^2$; the ion doped by the N type heavy doping is phosphorus ion, and a doping dose is $4*10^{14}$ ions/cm$^2$; the ion doped by the P type light doping is boron ion, and a doping dose is $2*10^{12}$ ions/cm$^2$.

The benefits of the present invention are: the present invention provides a manufacture method of a LTPS array substrate. By utilizing one halftone mask, the N type heavy doping, the channel doping of the first polysilicon layer of the NMOS region and the P type heavy doping of the second polysilicon layer of the PMOS region, the three processes which previously require three masks are integrated into one mask process, and two exposure processes are eliminated, which significantly raises the exposure capacity, and meanwhile saves the manufacture cost of two masks to effectively reduce the manufacture cost of the LTPS array substrate, and the manufactured LTPS array substrate possesses great electrical property.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
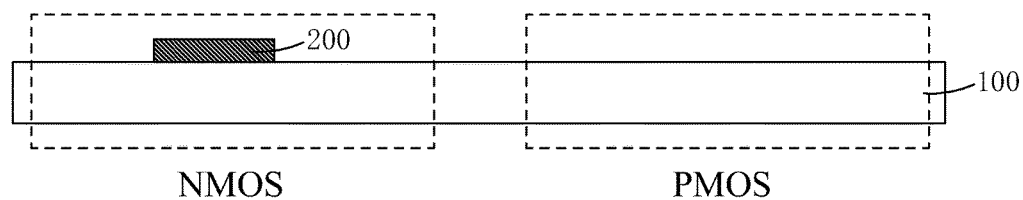
FIG. 1 is a diagram of the step 1 in the manufacture method of the LTPS array substrate according to prior art.
Figure 2:
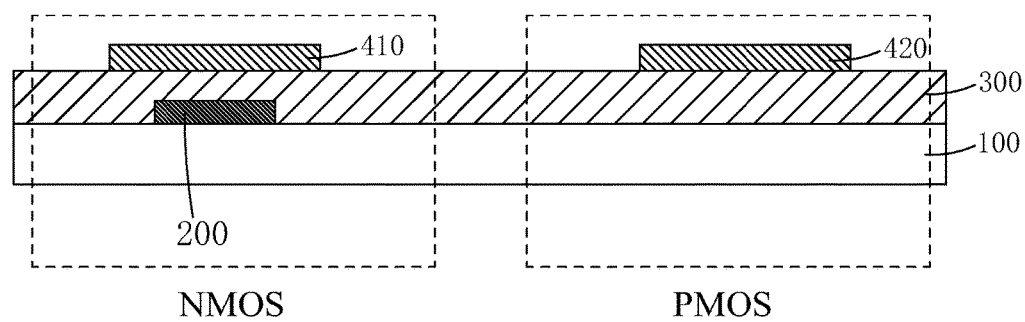
FIG. 2 is a diagram of the step 2 in the manufacture method of the LTPS array substrate according to prior art.
Figure 3:
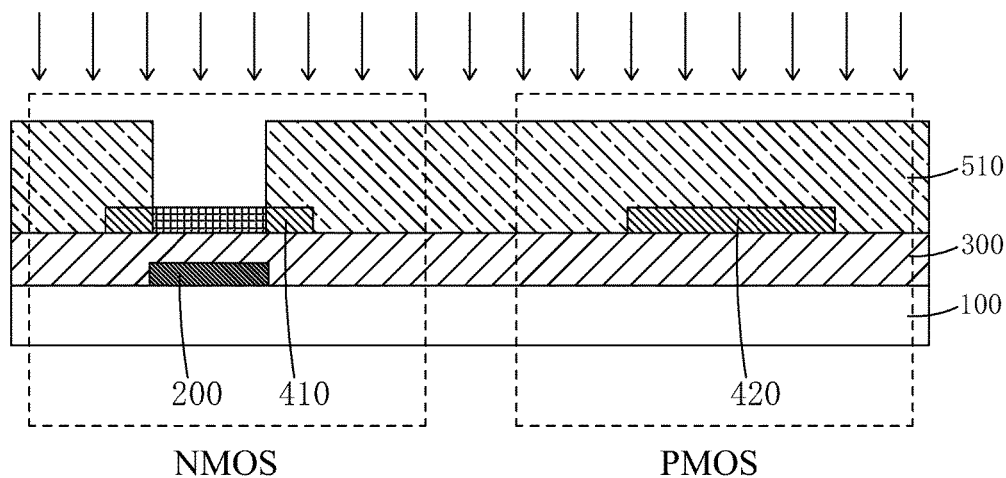
FIG. 3 is a diagram of the step 3 in the manufacture method of the LTPS array substrate according to prior art.
Figure 4:
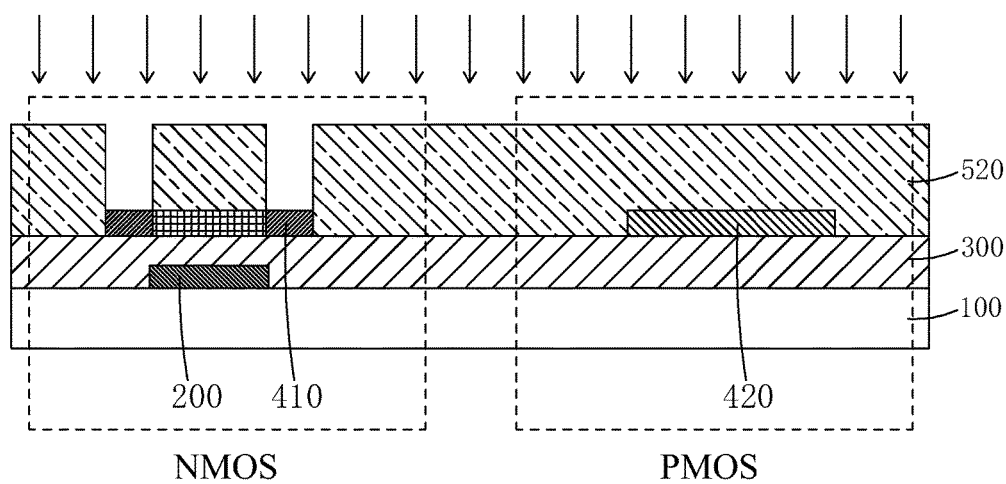
FIG. 4 is a diagram of the step 4 in the manufacture method of the LTPS array substrate according to prior art.
Figure 5:
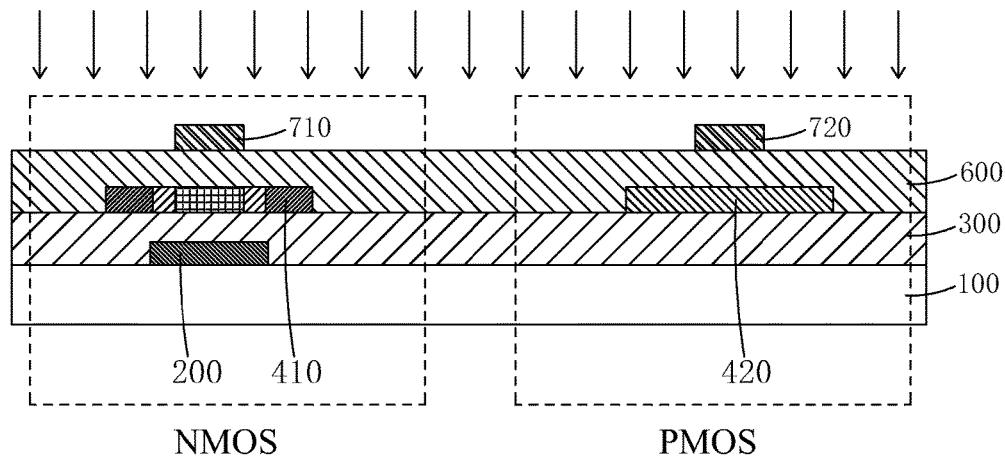
FIG. 5 is a diagram of the step 5 in the manufacture method of the LTPS array substrate according to prior art.
Figure 6:
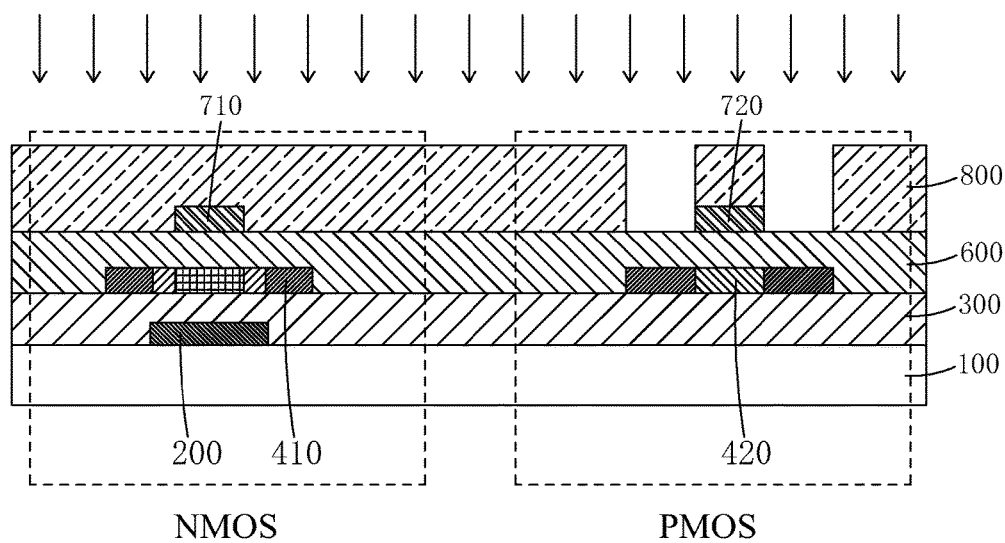
FIG. 6 is a diagram of the step 6 in the manufacture method of the LTPS array substrate according to prior art.
Figure 7:
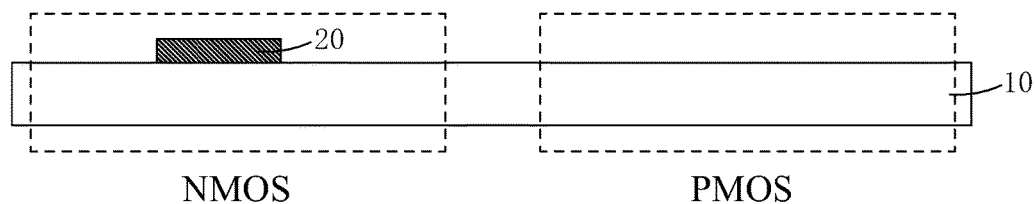
FIG. 7 is a diagram of the step 1 in the manufacture method of the LTPS array substrate according to the present invention.
Figure 8:
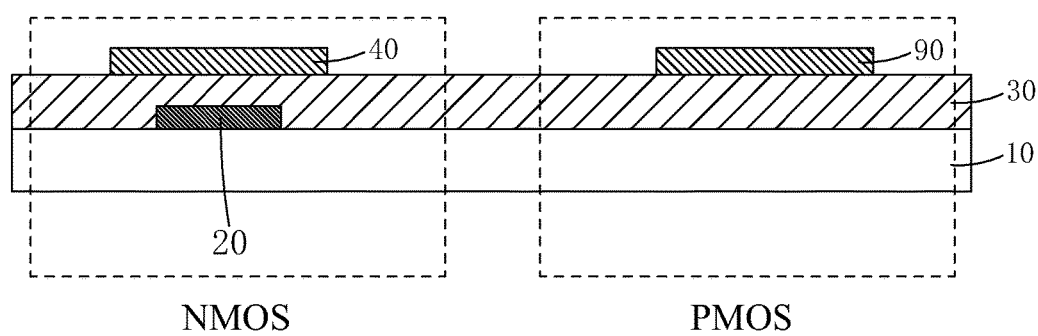
FIG. 8 is a diagram of the step 2 in the manufacture method of the LTPS array substrate according to the present invention.

Please refer to FIGS. 7-16, the present invention provides a manufacture method of a LTPS array substrate, comprising steps of:

step 1, as shown in FIG. 7, providing a substrate 10, and defining a NMOS region and a PMOS region on the substrate 10, and depositing a first metal layer on the substrate 10, and patterning the first metal layer to obtain a light shielding layer 20 in the NMOS region.

step 2, as shown in FIG. 8, forming a buffer layer 30 on the light shielding layer 20 and the substrate 10, and depositing an amorphous silicon layer on the buffer layer 30, and employing a low temperature crystallization process to convert the amorphous silicon layer into the polysilicon layer, and patterning the polysilicon layer to obtain a first polysilicon layer 40 in the NMOS region and a second polysilicon layer 90 in the PMOS region.

Figure 9A:
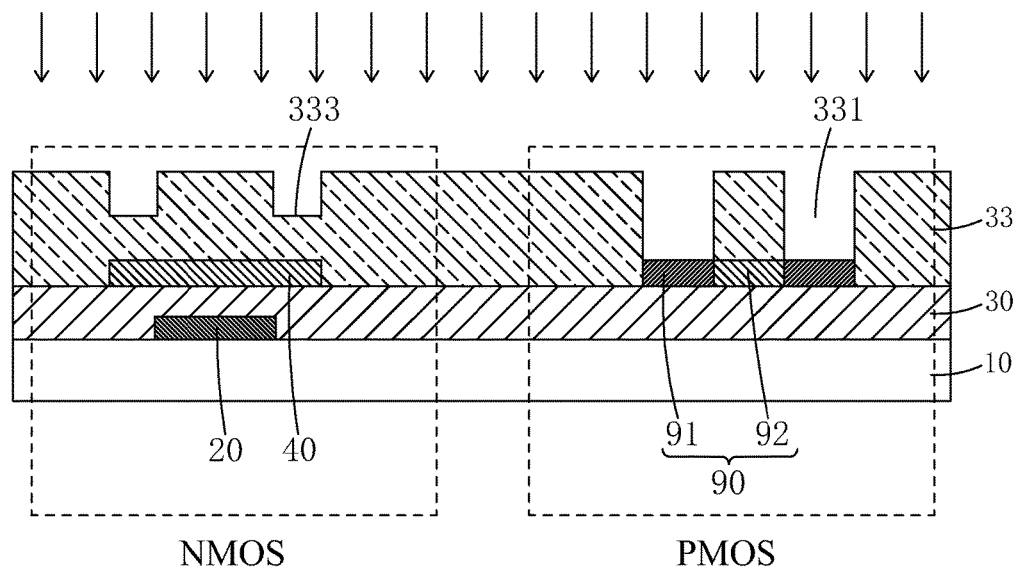
FIGS. 9A-9C are diagrams of the step 3 in the manufacture method of the LTPS array substrate according to the present invention.
Figure 9B:
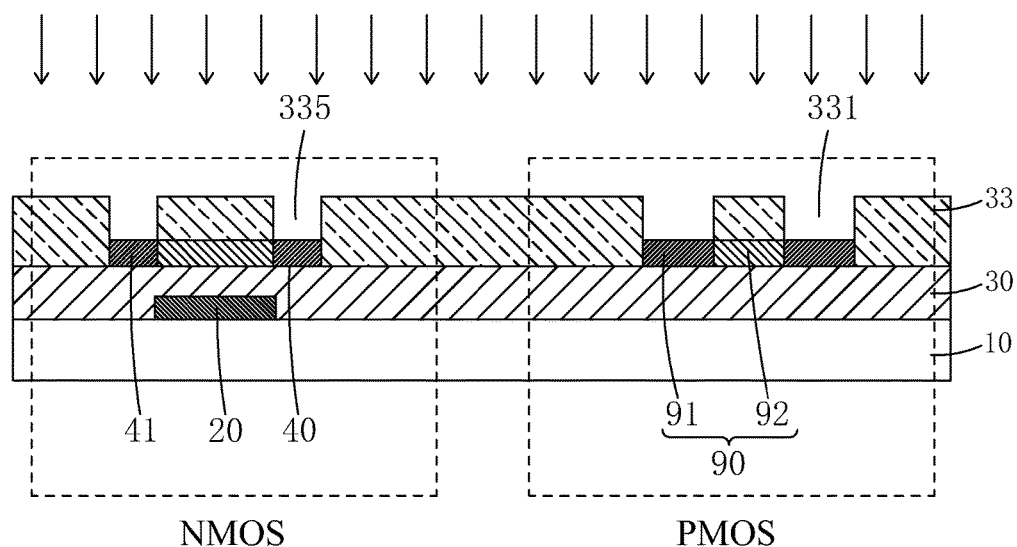
Figure 9C:
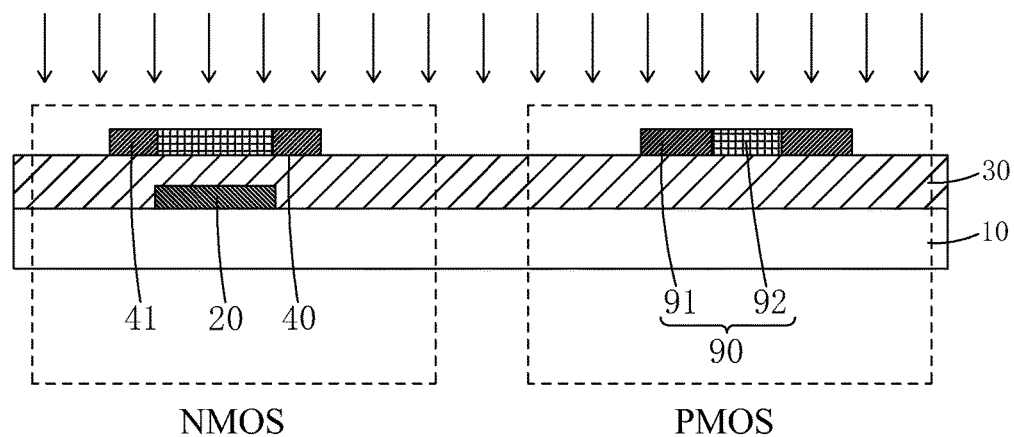

The low temperature crystallization process is Excimer Laser Annealing (ELA) or Metal-Induced Lateral Crystallization (MILC).

step 3, as shown in FIG. 9A, coating a photoresist layer 33 on the first polysilicon layer 40, the second polysilicon layer 90 and the buffer layer 30, and after employing a halftone mask to implement exposure, development to the photoresist layer 33, forming first vias 331 corresponding to two ends of the second polysilicon layer 90 in the photoresist layer 33 to expose the two ends of the second polysilicon layer 90, and meanwhile, forming first grooves 333 corresponding to two ends of the first polysilicon layer 40 in the photoresist layer 33; employing the photoresist layer 33 to be a mask to implement P type heavy doping to the two ends of the second polysilicon layer 90 to obtain two P type heavy doping regions 91, and forming a second channel region 92 on the second polysilicon layer 90 in a region between the two P type heavy doping regions 91;

as shown in FIG. 9B, employing a dry etching process to implement ashing treatment to the photoresist layer 33 to decrease a thickness of the photoresist layer 33 to make the first grooves 333 converted into second vias 335 to expose the two ends of the first polysilicon layer 40, and employing the photoresist layer 33 to be a mask to implement N type heavy doping to the two ends of the first polysilicon layer 40 to obtain two N type heavy doping regions 41;

as shown in FIG. 9C, employing a photoresist stripping process to completely strip the rest photoresist layer 33 to expose the first polysilicon layer 40 and the second polysilicon layer 90, and implementing P type light doping to the first polysilicon layer 40 and the second polysilicon layer 90 to achieve channel doping to the first polysilicon layer 40.

Specifically, in the step 3, the ion doped by the P type heavy doping is boron (B) ion, and a doping dose is $1*10^{15}$ ions/cm$^2$; the ion doped by the N type heavy doping is phosphorus (P) ion, and a doping dose is $4*10^{14}$ ions/cm$^2$; the ion doped by the P type light doping is boron (B) ion, and a doping dose is $2*10^{12}$ ions/cm$^2$.

The doping doses of the aforesaid three doping processes are sequentially decreased according to the order of doping. The doping of which the doping dose is the largest is implemented, first. Thus, it can reduce the influence of the latter doped element to the former doped region.

Figure 10:
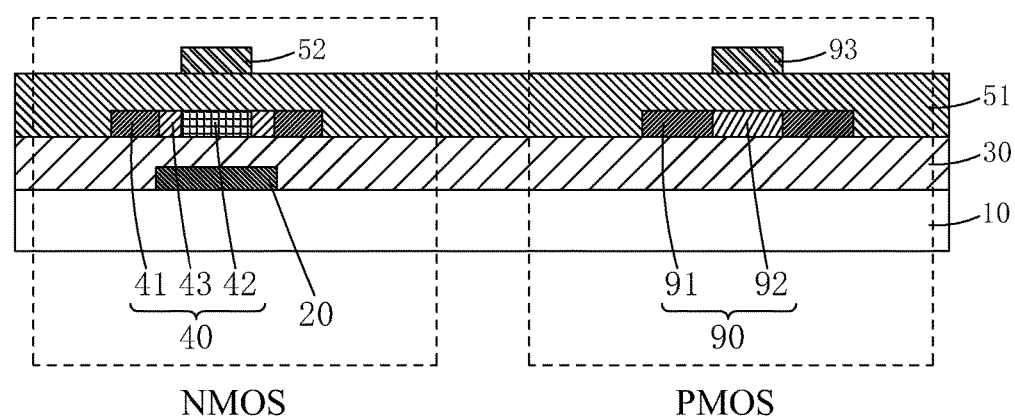
FIG. 10 is a diagram of the step 4 in the manufacture method of the LTPS array substrate according to the present invention.

Significantly, the step 3 utilizes one halftone mask, and the N type heavy doping, the channel doping of the first polysilicon layer 40 of the NMOS region and the P type heavy doping of the second polysilicon layer 90 of the PMOS region, the three processes which previously require three masks are integrated into one mask process, and two exposure processes are eliminated, which significantly raises the exposure capacity, and meanwhile saves the manufacture cost of two masks to effectively reduce the manufacture cost of the LTPS array substrate.

step 4, as shown in FIG. 10, depositing a gate isolation layer 51 on the first polysilicon layer 40, the second polysilicon layer 90 and the buffer layer 30, and depositing a second metal layer on the gate isolation layer 51, and patterning the second metal layer to obtain a first gate 52 and a second gate 93 correspondingly above the first polysilicon layer 40 and the second polysilicon layer 90, respectively;

employing the first gate 52 to be a mask to implement N type light doping to the first polysilicon layer 40 to obtain two N type light doping regions 43 respectively at inner sides of the two N type heavy doping regions 41, and a first channel region 42 is formed in a region between the two N type heavy doping regions 43 on the first polysilicon layer 40.

Figure 11:
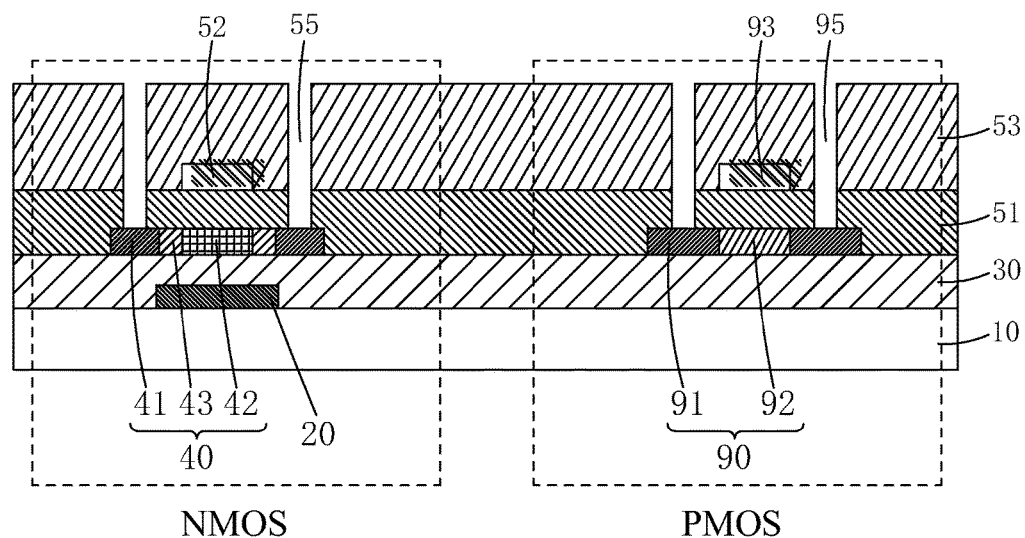
FIG. 11 is a diagram of the step 5 in the manufacture method of the LTPS array substrate according to the present invention.

Specifically, in the step 4, the ion doped by the N type light doping is phosphorus (P) ion, and a doping dose is $1.5*10^{13}$ ions/cm$^2$.

step 5, as shown in FIG. 11, depositing an interlayer insulation layer 53 on the first gate 52, the second gate 93 and the gate isolation layer 51, and patterning the interlayer insulation layer 53 and the gate isolation layer 51 to obtain a first via 55 above the N type heavy doping region 41 and a second via 95 above the P type heavy doping region 91, and then implementing dehydrogenation and activation treatments to the interlayer insulation layer 53.

Figure 12:
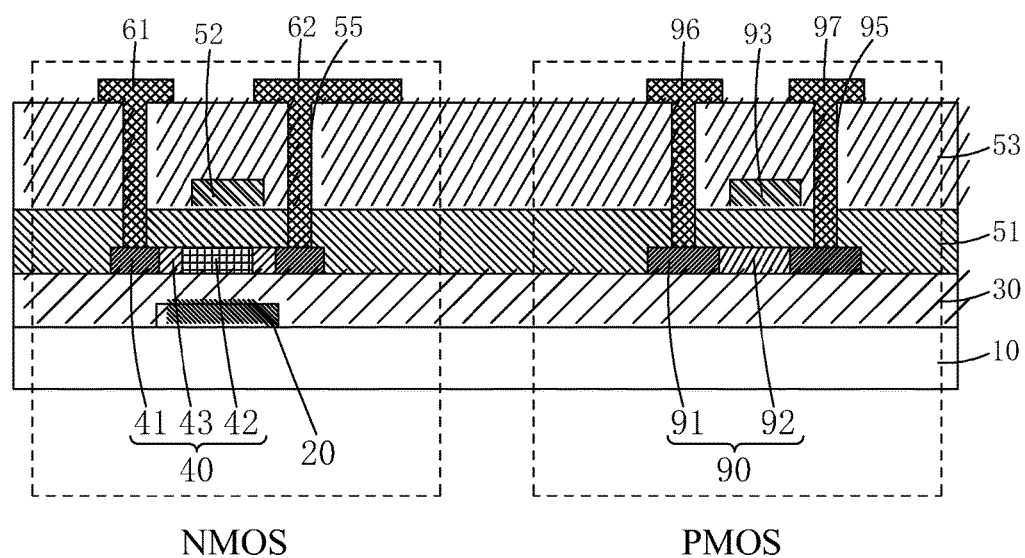
FIG. 12 is a diagram of the step 6 in the manufacture method of the LTPS array substrate according to the present invention.
Figure 13:
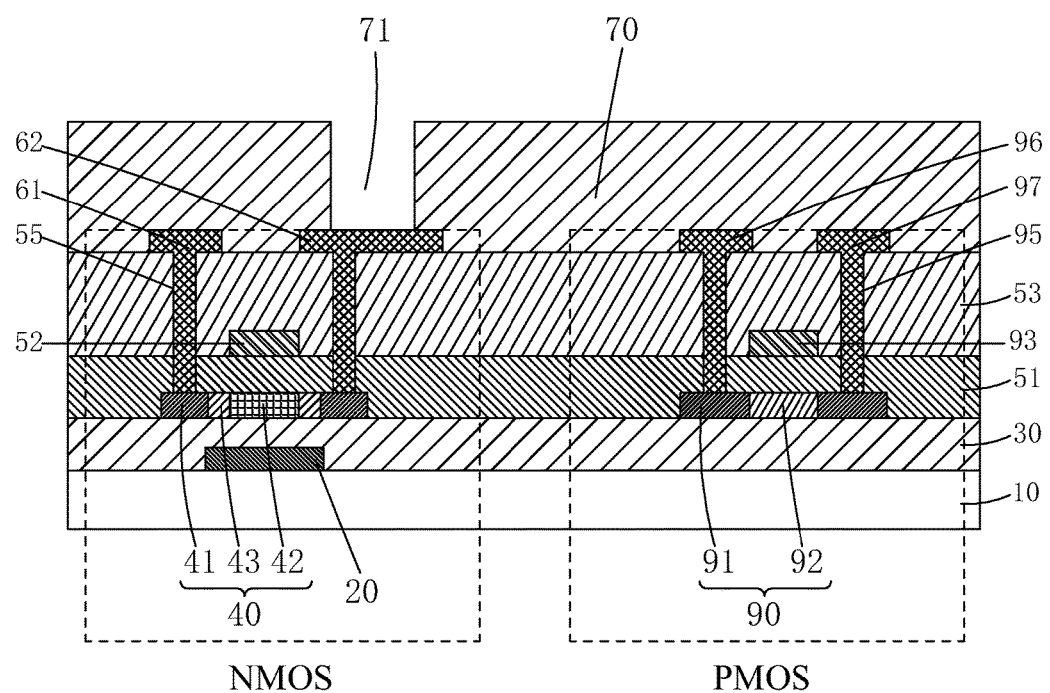
FIG. 13 is a diagram of the step 7 in the manufacture method of the LTPS array substrate according to the present invention.
Figure 14:
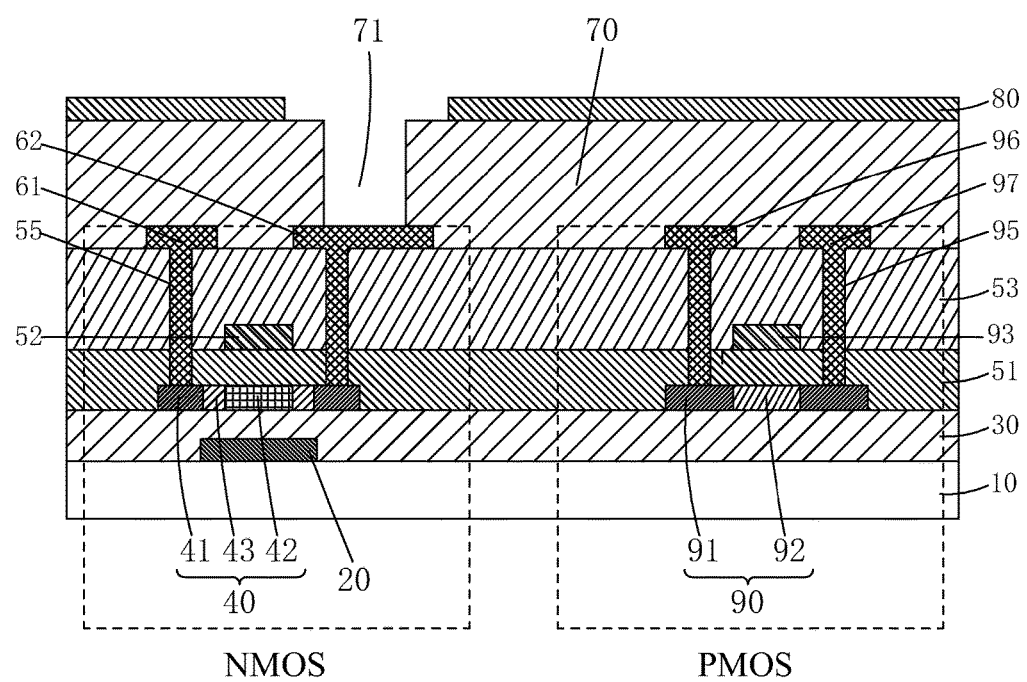
FIG. 14 is a diagram of the step 8 in the manufacture method of the LTPS array substrate according to the present invention.
Figure 15:
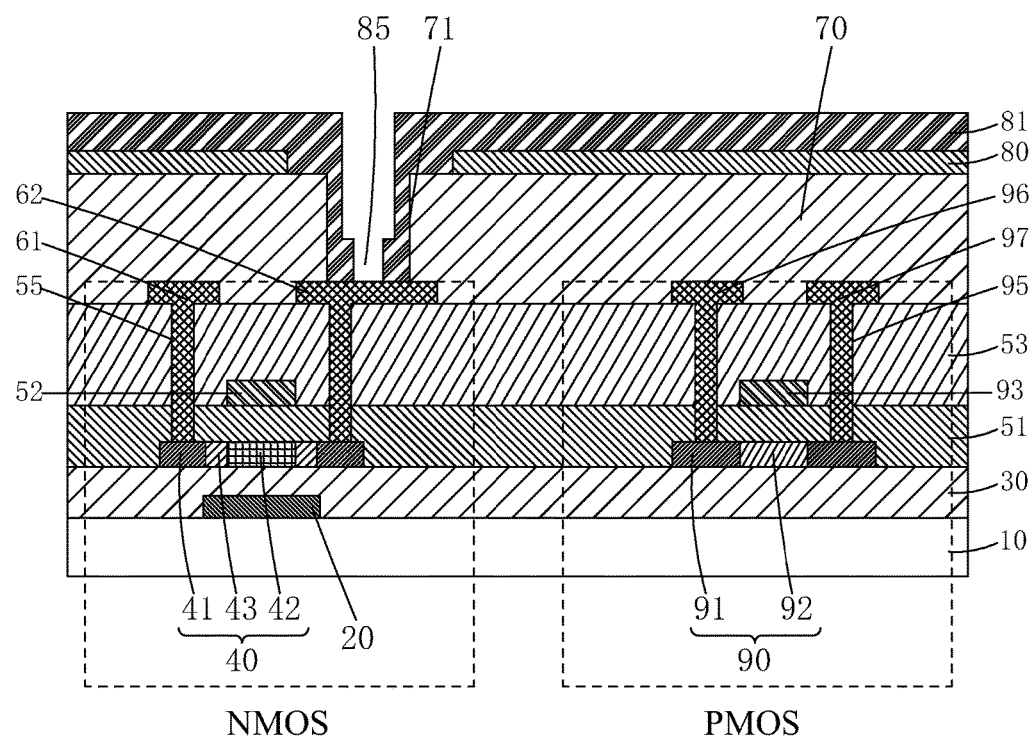
FIG. 15 is a diagram of the step 9 in the manufacture method of the LTPS array substrate according to the present invention.
Figure 16:
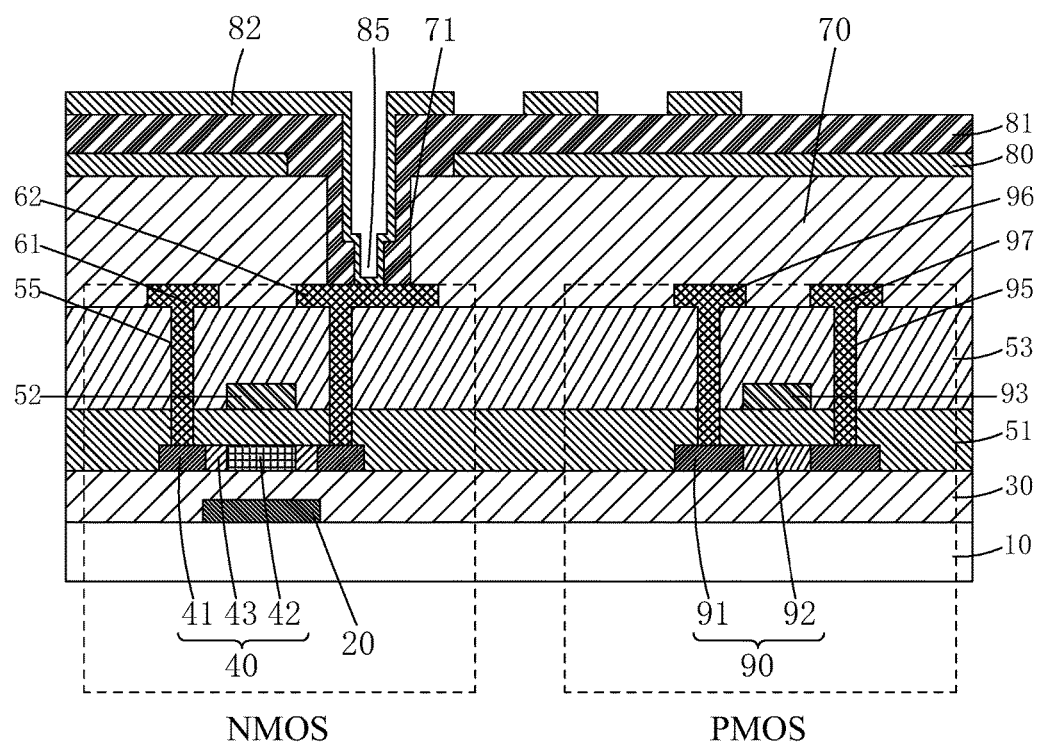
FIG. 16 is a diagram of the step 10 in the manufacture method of the LTPS array substrate according to the present invention.

Specifically, the RTA (Rapid Thermal Annealing) is utilized to implement dehydrogenation and activation treatments to the interlayer insulation layer 53.

step 6, as shown in FIG. 12, depositing a third metal layer on the interlayer insulation layer 53, and patterning the third metal layer to obtain a first source 61, a first drain 62, a second source 96 and a second drain 97, and the first source 61 and the first drain 62 respectively contact with the N type heavy doping region 41 through the first via 55, and the second source 96 and the second drain 97 respectively contact with the P type heavy doping region 91 through the second via 95.

step 7, as shown in FIG. 13, forming a flat layer 70 on the first source 61, the first drain 62, the second source 96, the second drain 97 and the interlayer insulation layer 53, and patterning the flat layer 70 to obtain a third via 71 above the first drain 62.

step 8, as shown in FIG. 14, depositing a first transparent conductive oxide layer on the flat layer 70, and patterning the first transparent conductive oxide layer to obtain a common electrode 80.

step 9, as shown in FIG. 15, depositing a passivation protective layer 81 on the common electrode 80 and the flat layer 70, and the passivation protective layer 81 covers the third via 71 on the flat layer 70, and then patterning the passivation protective layer 81 to obtain a fourth via 85 at a bottom of the third via 71 on the passivation protective layer 81.

step 10, as shown in FIG. 16, depositing a second transparent conductive oxide layer on the passivation protective layer 81, and patterning the second transparent conductive oxide layer to obtain a pixel electrode 82, and the pixel electrode 82 contacts with the first drain 62 through the fourth via 85.

Specifically, the substrate 10 is a transparent substrate, and preferably is a glass substrate.

Specifically, material of the first metal layer, the second metal layer and the third metal layer is a stack combination of one or more of molybdenum (Mo), titanium (Ti), aluminum (Al) and copper (Cu).

Specifically, the buffer layer 30, the gate isolation layer 51, the interlayer insulation layer 53 and the passivation protective layer 81 can be Silicon Oxide layers, Silicon Nitride layers or composite layers superimposed with Silicon Oxide ($SiO_x$) layers and Silicon Nitride ($SiN_x$) layers.

Specifically, material of the flat layer 70 is organic photoresist material.

Specifically, material of the first transparent conductive oxide layer and the second transparent conductive oxide layer is Indium Tin Oxide, Aluminum Tin Oxide, Aluminum Zinc Oxide, Indium Germanium Zinc Oxide or other proper oxides.

In conclusion, the present invention provides a manufacture method of a LTPS array substrate. By utilizing one halftone mask, the N type heavy doping, the channel doping of the first polysilicon layer of the NMOS region and the P type heavy doping of the second polysilicon layer of the PMOS region, the three processes which previously require three masks are integrated into one mask process, and two exposure processes are eliminated, which significantly raises the exposure capacity, and meanwhile saves the manufacture cost of two masks to effectively reduce the manufacture cost of the LTPS array substrate, and the manufactured LTPS array substrate possesses great electrical property.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a LTPS array substrate, comprising steps of:
   step 1, providing a substrate, and defining a NMOS region and a PMOS region on the substrate, and depositing a first metal layer on the substrate, and patterning the first metal layer to obtain a light shielding layer in the NMOS region;
   step 2, forming a buffer layer on the light shielding layer and the substrate, and depositing an amorphous silicon layer on the buffer layer, and employing a low temperature crystallization process to convert the amorphous silicon layer into the polysilicon layer, and patterning the polysilicon layer to obtain a first polysilicon layer in the NMOS region and a second polysilicon layer in the PMOS region;
   step 3, coating a photoresist layer on the first polysilicon layer, the second polysilicon layer and the buffer layer, and after employing a halftone mask to implement exposure, development to the photoresist layer, forming first vias corresponding to two ends of the second polysilicon layer in the photoresist layer to expose the two ends of the second polysilicon layer, and meanwhile, forming first grooves corresponding to two ends of the first polysilicon layer in the photoresist layer;
   employing the photoresist layer to be a mask to implement P type heavy doping to the two ends of the second polysilicon layer to obtain two P type heavy doping regions, and forming a second channel region on the second polysilicon layer in a region between the two P type heavy doping regions;
   employing a dry etching process to implement ashing treatment to the photoresist layer to decrease a thickness of the photoresist layer to make the first grooves converted into second vias to expose the two ends of the first polysilicon layer, and employing the photoresist layer to be a mask to implement N type heavy doping to the two ends of the first polysilicon layer to obtain two N type heavy doping regions;
   employing a photoresist stripping process to completely strip the rest photoresist layer to expose the first polysilicon layer and the second polysilicon layer, and implementing P type light doping to the first polysilicon layer and the second polysilicon layer to achieve channel doping to the first polysilicon layer.

2. The manufacture method of the LTPS array substrate according to claim 1, further comprising steps of:
   step 4, depositing a gate isolation layer on the first polysilicon layer, the second polysilicon layer and the buffer layer, and depositing a second metal layer on the gate isolation layer, and patterning the second metal layer to obtain a first gate and a second gate correspondingly above the first polysilicon layer and the second polysilicon layer, respectively;
   employing the first gate to be a mask to implement N type light doping to the first polysilicon layer to obtain two N type light doping regions respectively at inner sides of the two N type heavy doping regions, and a first channel region is formed in a region between the two N type heavy doping regions on the first polysilicon layer;
   step 5, depositing an interlayer insulation layer on the first gate, the second gate and the gate isolation layer, and patterning the interlayer insulation layer and the gate isolation layer to obtain a first via above the N type heavy doping region and a second via above the P type heavy doping region;
   step 6, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second drain respectively contact with the P type heavy doping region through the second via;
   step 7, forming a flat layer on the first source, the first drain, the second source, the second drain and the interlayer insulation layer, and patterning the flat layer to obtain a third via above the first drain;
   step 8, depositing a first transparent conductive oxide layer on the flat layer, and patterning the first transparent conductive oxide layer to obtain a common electrode;
   step 9, depositing a passivation protective layer on the common electrode and the flat layer, and the passivation protective layer covers the third via on the flat layer, and then patterning the passivation protective layer to obtain a fourth via at a bottom of the third via on the passivation protective layer;
   step 10, depositing a second transparent conductive oxide layer on the passivation protective layer, and patterning the second transparent conductive oxide layer to obtain a pixel electrode, and the pixel electrode contacts with the first drain through the fourth via.

3. The manufacture method of the LTPS array substrate according to claim 1, wherein in the step 2, the low temperature crystallization process is Excimer Laser Annealing or Metal-Induced Lateral Crystallization.

4. The manufacture method of the LTPS array substrate according to claim 1, wherein in the step 3, the ion doped by the P type heavy doping is boron ion, and a doping dose is $1*10^{15}$ ions/cm²; the ion doped by the N type heavy doping is phosphorus ion, and a doping dose is $4*10^{14}$ ions/cm²; the ion doped by the P type light doping is boron ion, and a doping dose is $2*10^{12}$ ions/cm².

5. The manufacture method of the LTPS array substrate according to claim 2, wherein in the step 4, the ion doped by the N type light doping is phosphorus ion, and a doping dose is $1.5*10^{13}$ ions/cm².

6. The manufacture method of the LTPS array substrate according to claim 2, wherein the step 5 further comprises implementing the dehydrogenation and activation treatments to the interlayer insulation layer.

7. The manufacture method of the LTPS array substrate according to claim 6, wherein rapid thermal annealing is employed to implement the dehydrogenation and activation treatments to the interlayer insulation layer.

8. The manufacture method of the LTPS array substrate according to claim 2, wherein the substrate is a glass substrate; material of the first metal layer, the second metal layer and the third metal layer is a stack combination of one or more of molybdenum, titanium, aluminum and copper; the buffer layer, the gate isolation layer, the interlayer insulation layer and the passivation protective layer are Silicon Oxide layers, Silicon Nitride layers or composite layers superimposed with Silicon Oxide layers and Silicon Nitride layers; the flat layer is organic photoresist material.

9. The manufacture method of the LTPS array substrate according to claim 2, wherein material of the first transparent conductive oxide layer and the second transparent conductive oxide layer is metal oxide.

10. The manufacture method of the LTPS array substrate according to claim 9, wherein the metal oxide is Indium Tin Oxide, Aluminum Tin Oxide, Aluminum Zinc Oxide or Indium Germanium Zinc Oxide.

11. A manufacture method of a LTPS array substrate, comprising steps of:
    step 1, providing a substrate, and defining a NMOS region and a PMOS region on the substrate, and depositing a first metal layer on the substrate, and patterning the first metal layer to obtain a light shielding layer in the NMOS region;
    step 2, forming a buffer layer on the light shielding layer and the substrate, and depositing an amorphous silicon layer on the buffer layer, and employing a low temperature crystallization process to convert the amorphous silicon layer into the polysilicon layer, and patterning the polysilicon layer to obtain a first polysilicon layer in the NMOS region and a second polysilicon layer in the PMOS region;
    step 3, coating a photoresist layer on the first polysilicon layer, the second polysilicon layer and the buffer layer, and after employing a halftone mask to implement exposure, development to the photoresist layer, forming first vias corresponding to two ends of the second polysilicon layer in the photoresist layer to expose the two ends of the second polysilicon layer, and meanwhile, forming first grooves corresponding to two ends of the first polysilicon layer in the photoresist layer; employing the photoresist layer to be a mask to implement P type heavy doping to the two ends of the second polysilicon layer to obtain two P type heavy doping regions, and forming a second channel region on the second polysilicon layer in a region between the two P type heavy doping regions;
    employing a dry etching process to implement ashing treatment to the photoresist layer to decrease a thickness of the photoresist layer to make the first grooves converted into second vias to expose the two ends of the first polysilicon layer, and employing the photoresist layer to be a mask to implement N type heavy doping to the two ends of the first polysilicon layer to obtain two N type heavy doping regions;
    employing a photoresist stripping process to completely strip the rest photoresist layer to expose the first polysilicon layer and the second polysilicon layer, and implementing P type light doping to the first polysilicon layer and the second polysilicon layer to achieve channel doping to the first polysilicon layer;
    step 4, depositing a gate isolation layer on the first polysilicon layer, the second polysilicon layer and the buffer layer, and depositing a second metal layer on the gate isolation layer, and patterning the second metal layer to obtain a first gate and a second gate correspondingly above the first polysilicon layer and the second polysilicon layer, respectively;
    employing the first gate to be a mask to implement N type light doping to the first polysilicon layer to obtain two N type light doping regions respectively at inner sides of the two N type heavy doping regions, and a first channel region is formed in a region between the two N type heavy doping regions on the first polysilicon layer;
    step 5, depositing an interlayer insulation layer on the first gate, the second gate and the gate isolation layer, and patterning the interlayer insulation layer and the gate isolation layer to obtain a first via above the N type heavy doping region and a second via above the P type heavy doping region;
    step 6, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second drain respectively contact with the P type heavy doping region through the second via;
    step 7, forming a flat layer on the first source, the first drain, the second source, the second drain and the interlayer insulation layer, and patterning the flat layer to obtain a third via above the first drain;
    step 8, depositing a first transparent conductive oxide layer on the flat layer, and patterning the first transparent conductive oxide layer to obtain a common electrode;
    step 9, depositing a passivation protective layer on the common electrode and the flat layer, and the passivation protective layer covers the third via on the flat layer, and then patterning the passivation protective layer to obtain a fourth via at a bottom of the third via on the passivation protective layer;
    step 10, depositing a second transparent conductive oxide layer on the passivation protective layer, and patterning the second transparent conductive oxide layer to obtain a pixel electrode, and the pixel electrode contacts with the first drain through the fourth via;
    wherein in the step 2, the low temperature crystallization process is Excimer Laser Annealing or Metal-Induced Lateral Crystallization;
    wherein in the step 3, the ion doped by the P type heavy doping is boron ion, and a doping dose is $1*10^{15}$ ions/cm²; the ion doped by the N type heavy doping is phosphorus ion, and a doping dose is $4*10^{14}$ ions/cm²;

the ion doped by the P type light doping is boron ion, and a doping dose is $2*10^{12}$ ions/cm$^2$.

12. The manufacture method of the LTPS array substrate according to claim 11, wherein in the step 4, the ion doped by the N type light doping is phosphorus ion, and a doping dose is $1.5*10^{13}$ ions/cm$^2$.

13. The manufacture method of the LTPS array substrate according to claim 11, wherein the step 5 further comprises implementing the dehydrogenation and activation treatments to the interlayer insulation layer.

14. The manufacture method of the LTPS array substrate according to claim 13, wherein rapid thermal annealing is employed to implement the dehydrogenation and activation treatments to the interlayer insulation layer.

15. The manufacture method of the LTPS array substrate according to claim 11, wherein the substrate is a glass substrate; material of the first metal layer, the second metal layer and the third metal layer is a stack combination of one or more of molybdenum, titanium, aluminum and copper; the buffer layer, the gate isolation layer, the interlayer insulation layer and the passivation protective layer are Silicon Oxide layers, Silicon Nitride layers or composite layers superimposed with Silicon Oxide layers and Silicon Nitride layers; the flat layer is organic photoresist material.

16. The manufacture method of the LTPS array substrate according to claim 11, wherein material of the first transparent conductive oxide layer and the second transparent conductive oxide layer is metal oxide.

17. The manufacture method of the LTPS array substrate according to claim 16, wherein the metal oxide is Indium Tin Oxide, Aluminum Tin Oxide, Aluminum Zinc Oxide or Indium Germanium Zinc Oxide.

* * * * *